United States Patent [19]
Hayashi

[11] Patent Number: 5,786,305
[45] Date of Patent: Jul. 28, 1998

[54] PROCESS FOR MANUFACTURING A COMPOUND OXIDE-TYPE SUPERCONDUCTING WIRE

[75] Inventor: Kazuhiko Hayashi, Osaka, Japan

[73] Assignee: Sumitomo Electric Industries Ltd., Osaka, Japan

[21] Appl. No.: 56,615

[22] Filed: May 4, 1993

Related U.S. Application Data

[63] Continuation of Ser. No. 877,393, Apr. 30, 1992, abandoned, which is a continuation of Ser. No. 596,407, Oct. 5, 1990, abandoned, which is a continuation of Ser. No. 161,480, Feb. 29, 1988, abandoned.

[30] Foreign Application Priority Data

Feb. 28, 1987 [JP] Japan ................................. 62-46577

[51] Int. Cl.$^6$ ............................................... H01L 39/24
[52] U.S. Cl. .......................... 505/433; 29/599; 505/500; 505/739; 505/740; 505/928
[58] Field of Search ......................... 29/599; 505/430, 505/433, 500, 739, 740, 928

[56] References Cited

U.S. PATENT DOCUMENTS

| | | | |
|---|---|---|---|
| 3,162,943 | 12/1964 | Wong | 29/599 |
| 3,245,141 | 4/1966 | Gruetjen | 29/505 X |
| 3,932,315 | 1/1976 | Sleight | 252/521 |
| 4,704,249 | 11/1987 | Glatzle | 419/4 |
| 5,106,825 | 4/1992 | Mandigo et al. | 29/599 X |
| 5,145,833 | 9/1992 | Prunier, Jr. et al. | 505/739 X |

FOREIGN PATENT DOCUMENTS

| | | |
|---|---|---|
| 0 302 791 | 2/1989 | European Pat. Off. . |
| 0022592 | 8/1979 | Japan ................... 29/599 |
| 61-131307 | 6/1986 | Japan . |
| 0 281 444 | 9/1988 | Japan . |
| 47-31859 | 11/1992 | Japan . |

OTHER PUBLICATIONS

Critical Current Density of Wire Type Y–Ba–Cu Oxide Superconductor, Yamada et al. Japanese Journal of Applied Physics.
Superconducting Wires Of High Tc Oxides, Ohmatsu et al. Japanese Journal of Applied Physics, vol. 26 (1987).
Applied Physics Letters, vol. 48, No. 26, 30th Jun. 1986, pp. 1808–1810, American Institute of Physics, New York, U.S. : S. Pourrahimi et al.
"Nb3Sn(Ti) powder metallurgy processed high field superconductors", p. 1808, Left–hand colunm, paragraph 1.
Zietschrift Fur Physik B —Condensed Matter, vol. 64, 1986 pp. 189–193. Springer–Verlag J.G. Bednorz et al. the Ba–La–Cu–O system, Abstract.
Applied Physics Letters, vol. 51, No. 3, 20th Jul. 1987, pp. 203–204, American Institute of Physics, New York, U.S. : S. Jin et al. : "High Tc superconductors —composite wire fabrication", Abstract.
Bednorz et al. "Possible High $T_c$ Superconductivity in the Ba–La–Cu–O System", Z. Phys. B —Condensed Matter 64, (1986) pp. 189–193.

*Primary Examiner*—Joseph M. Gorski
*Attorney, Agent, or Firm*—Foley & Lardner

[57] ABSTRACT

A process for manufacturing a wire made of oxide which is applicable for manufacturing a superconducting coil or the like. The process includes steps comprising preparing a mass of oxide having superconductivity from powder material, covering the mass of oxide with a metal pipe, and then reducing the diameter of the metal pipe containing the mass of oxide therein into a wire form by such plastic deformation that exert mainly compressive strain upon the metal pipe. The mass of oxide may be a compound oxide having Perovskite-type crystal structure exhibiting superconductivity. The metal pipe may be made of a metal selected from a group comprising Cu, Al, Nb, V, Mo, Ta, and Ag and of an alloy including these metals as the base. The mass of oxide may be produced by steps including extruding a powder material into a rod shape and then sintering the molded rod at a temperature ranging from 700° to 1,000° C. The plastic deformation of the metal pipe containing the mass of oxide therein may be carried out by swaging.

10 Claims, 2 Drawing Sheets

PROCESS FOR MANUFACTURING A COMPOUND OXIDE-TYPE SUPERCONDUCTING WIRE

This application is a continuation of application Ser. No. 07/877,393, filed Apr. 30, 1992, now abandoned; which is a continuation of application Ser. No. 07/596,407, filed Oct. 5, 1990, now abandoned; which is a continuation of application Ser. No. 07/161,480, filed Feb. 29, 1988, now abandoned.

BACKGROUND OF THE INVENTION

1. Field of the Invention

The present invention relates to a process for manufacturing a superconducting wire of a compound oxide-type ceramic which can be used for a superconducting coil or the like.

Particularly, the present invention relates to a process for manufacturing a superconducting wire made of sintered ceramic of compound oxide having higher critical current density and higher critical transition temperature of superconductivity.

2. Description of the Related Art

The superconductivity is a phenomenon in which the electrical resistance becomes zero and hence can be utilized to realize power cables and a variety of devices and apparatus which are requested to reduce consumption of electrical energy and several ideas of its applications which utilize the phenomenon of superconductivity have been proposed.

In fact, superconductivity is applicable in a variety of industrial fields, for example in the field of electrical power supply such as fusion power, MHD power generation, power transmission, or electric power reservation; in the field of transportation such as magnetic levitation trains, magnetically propelled ships; in the medical field such as high-energy beam radiation units; in the field of science such as NMR or high-energy physics; or in the field of sensors or detectors for sensing very weak magnetic field, microwave, radiant ray or the like as well as in the field of electronics such as Josephson Junction devices and high-speed computers with reduced energy consumption.

However, actual usage has been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2 K at most.

This means that liquid helium (boiling point of 4.2 K) is the only cryogen that can realize such very low temperature of Tc. However, helium is not only a limited costly resource but also requires a large-scale system for liquefaction. Therefore, other superconducting materials having much higher Tc were desired. But no material which exceeded the abovementioned Tc had been found for all studies for the past ten years.

It is known that certain ceramics material of compound oxides exhibit the property of superconductivity. For example, U.S. Pat. No. 3,932,315 discloses a Ba-Pb-Bi-type compound oxide which shows superconductivity. This type of superconductor, however, possess a rather low transition temperature of less than 13 K and hence use of liquid helium (boiling point of 4.2 K) as cryogen is indispensable to realize superconductivity.

Possibility of existence of a new type of superconducting material having much higher Tc was revealed by Bednorz and Muller who discovered a new oxide type superconductor in 1986 (Z. Phys. B64 (1986) p189).

This new oxide type superconducting material is [La, Ba]$_2$CuO$_4$ which is the so-called $K_2NiF_4$-type oxide having a crystal structure similar to Perovskite-type superconducting oxides which were known in the past (for example, $BaPb_{1-x}Bi_xO_3$ disclosed in U.S. Pat. No. 3,932,315). The $K_2NiF_4$-type oxides show such higher Tc as about 30 K which is much higher than that of known superconducting materials.

As the compound oxide type superconductors consisting of oxides of elements of IIa and IIIa groups in the Periodic Table, there are also so-called, quasi-Perovskite structures which can be considered to have such a crystal structure that are similar to Perovskite-type oxides and include an orthorhombically distorted perovskite or a distorted oxygen-deficient perovskite such as $Ba_2YCu_3O_7$-$\delta$ in addition to the abovementioned $K_2NiF_4$-type oxide such as [La, Ba]$_2$CuO$_4$ or [La, Sr]$_2$CuO$_4$. Since these superconducting materials show very high Tc of 30 to 90 K, it is possible to use liquid hydrogen (b.p.=20.4 K) or liquid neon (b.p.=27.3 K) as a cryogen for realizing the superconductivity in practice. Particularly, hydrogen in an inexhaustable resource, although it poses a risk of explosion.

Therefore, the application of these superconducting oxides having the layered perovskite structure in the field of electric power transmission have become the object of public attention. However, their molding has been limited to powder sintering technique, so that they are molded into a desire shape by means of a combination of press-molding and sintering or so-called HIP (hot isostatic pressing). Thus, the above mentioned new type superconducting materials have been studied and developed only in a form of sintered bodies as a bulk produced from powders. In other words, no attempt has been tried to use the oxide as a medium for transmitting electric power and no trial to shape the oxide into a wire form has been made except in very rare cases.

The oxide type ceramic materials possess no superior plasticity or processability in comparison with well-known metal type superconducting materials such as Ni-Ti alloy, and therefore they can not or are difficult to shape or deform into a wire form by conventional techniques such as wire-drawing techniques in which a superconducting metal is drawn directly or in embedded condition in copper to a wire form.

Japanese patent laid-open No. 61-131,307 proposes a method for manufacturing a superconducting wire from a metal type superconducting material which is apt to be oxidized and very fragile such as $PbMo_{0.35}S_8$, comprising charging the material powder in a metal shell, extruding the metal shell filled with the material powder at a temperature higher than 1,000° C., and then drawing the extruded composite. This metal working technique, however, can not apply directly to ceramic material consisting of compound oxide, because the compound oxide type superconducting materials can not exhibit the superconductivity if the specified or predetermined crystal structure is not realized. In other words, a superconducting wire having higher critical temperature and higher critical current density and which is usable in actual applications can not be obtained outside predetermined optimum conditions. In particular, if the shell is not selected from proper materials, the resulting compound oxide will be reduced due to chemical reaction with the metal of the shell, resulting in poor or inferior properties of superconductivity.

In the field of ceramic molding, it has been the general practice in manufacturing an elongated article such as wires or rods to add an organic binder to the material powder of ceramic in order to facilitate shaping or molding of the powder material. Thus, a mixture of the powder material and the organic binder is shaped into a rod by means of an extruder or a press machine and then the shaped rod is passed directly or through a trimming or cutting stage to an intermediate sintering stage to remove the organic binder before it is fed to the final sintering stage.

The combination of the abovementioned press-molding and trimming or cutting operations loses much of the expensive ceramic material, so that not only is economy of material low, but also a dimensional ratio of longitudinal direction to cross sectional direction of the rod can not be increased. Therefore, this process can not be used in practice.

The extrusion technique is much better than the press-molding technique in the economy of material and productivity, but requires great quantities of organic binder added to the powder material. This organic binder is difficult to remove completely during the intermediate sintering stage and hence remains in the finally sintered article, resulting in defects of the product which will lower the strength and the resistance to flexion. Therefore, it is difficult to manufacture a fine rod of ceramics having higher dimensional ratios of longitudinal direction to cross sectional direction according to the extrusion technique.

In order to realize a reliable and practical superconducting structure, it is indispensable that the structure possess enough strength and tenacity to endure bending force during usage and also that the structure have as fine a cross sectional dimension as possible so that it can transmit currency at higher critical current density and at higher critical temperature.

The present applicant proposed, in the previous U.S. patent applicant Ser. No. 152,713 titled "Process for Manufacturing a Superconducting Wire of Compound Oxide-type Ceramic" filed on Feb. 5, 1988, incorporated herein by reference, a method for manufacturing a superconducting elongated article including steps comprising filling a metal pipe with material powder of ceramic consisting of compound oxide having superconductivity, performing plastic deformation of the metal pipe filled with the ceramic metal powder to reduce the cross section of the metal pipe, and then subjecting the deformed metal pipe to heat-treatment to sinter the ceramic material powder filled in the metal pipe.

This previous method itself is satisfactory, but requires the first step of compacting material ceramic powder in a metal pipe, so that a skilled hand is required to obtain the high compacting density. If the powder is not filled in desired compacted condition, higher critical current density ($J_c$) can not be expected. We continued to develop another technique which can support superconducting material in an outer metal layer and finally found out the present invention.

Therefore, an object of the present invention is to provide a process for shaping the abovementioned oxide into a wire form so that an oxide wire can be manufactured without difficulty.

Another object of the present invention is to provide a process for manufacturing a fine superconducting wire of compound oxide type sintered ceramic having higher critical current density and higher critical temperature.

SUMMARY OF THE INVENTION

The present invention resides in a process for manufacturing a wire made of oxide characterized by steps comprising preparing a mass of oxide having superconductivity from powder material, covering the mass of oxide with a metal pipe, and then reducing the diameter of the metal pipe containing the mass of oxide therein into a wire form by means of plastic deformation which is performed mainly under compressive strain.

The term "mass of oxide having superconductivity" means a self-supporting body or block made of oxide and having superconductivity by itself. In general, this mass of oxide may be a preliminary sintered body or a solid solution obtained from material powder mixture and can be produced by molding a powder mixture into a rod shape and then heating the molded rod to produce a mass of oxide having superconductivity.

DESCRIPTION OF THE PREFERRED EMBODIMENTS

The mass of oxide having superconductivity which can be used in the process of the present invention may be made of an oxide having a layered perovskite structure and having the general formula:

$$(A_{1-x}B_x)_2CO_{4-y}$$

in which "A" stands for at least one element selected from lanthanide elements of the Periodic Table, "B" stands for at least one element selected from a group comprising Ia, IIa and IIIb elements of the Periodic Table, "C" stands for at least one element selected from a group comprising Ib, IIb, IIIa elements or transition elements of the Periodic, and small letters "x" and "y" are numbers which satisfy $0<x<1$, and $0 \leq y<4$.

As the element of Ia group in the Periodic Table, it can be mentioned H, Li, Na, K, Rb, Cs and Fr. The elements of IIa in the Periodic Table may be Be, Mg, Ca, Sr, Ba and Ra. The elements of IIIb in the Periodic Table may be Sc, Y, La, Ce, Pr, Nd, Pm, Sm, Eu, Gd, Tb, Dy, Ho, Er, Tm, Yb, Lu, Ac, Th, Pa, Pa, U, Np, Pu, Am, Cm, Bk, Cf, Es, Fm, Md, Mo and Lr. The elements of Ib in the Periodic Table may be Cu, Ag and Au. The elements of IIb in the Periodic Table may be Zn, Cd and Hg. The elements of IIIa in the Periodic Table may be B, Al, Ga, In and Tl.

Among a variety of mass of oxide having superconductivity which can be used in the present invention, the following examples may be mentioned.

a mass of compound oxide containing at least one element selected from IIa groups of the Periodic Table, at least one element selected from IIIb groups of the Periodic Table, and copper, for example, La-Sr-Cu-O type ceramics and La-Ba-Cu-O type ceramics, more precisely, compound oxides having the crystal structure of $K_2NiF_4$-type oxides, such as $[La, Ba]_2CuO_4$ or $[La, Sr]_2CuO_4$; Y-Ba-Cu-O type ceramics, Y-Sr-Cu-O type ceramics, more precisely, compound oxides having layered perovskite or oxygen deficient perovskite structure, such as $YBa_2Cu_3O_7$-* or $YSr_2Cu_3O_7$-* ("*" stands for a number satisfying $0<y \leq 1$); and more generally, Ln-(Ba,Sr)-Cu-O type ceramics (wherein, "Ln" stands for lanthanide element) of compound oxide such as $HoBa_2Cu_3O_7$-*, $HoSr_2Cu_3O_7$-* ("*" stands for a number satisfying $0<y \leq 1$);

a mass of compound oxide containing at least two elements selected from IIa groups of the Periodic Table, for example Ca and Sr, at least one element selected from IV and V groups of the Periodic Table, such as Bi, and copper, but containing no IIIa groups element of the Period Table, for example, Ca-Sr-Bi-Cu-O type ceramics such as $CaSrBiCu_2O_7$-* ("*" stands for a number satisfying $0<y \leq 3$); and a mass of compound oxide composed mainly of the abovementioned elements and small amount of additives selected from a group comprising IVb, Vb, VIb and VIIIb groups of the Periodic Table, such as Ti.

The mass of oxide use din the present invention are not limited to those abovementioned.

The mass of oxides may be produced by a combination of molding and sintering. For example, the mass of oxide can be produced by steps comprising mixing material powders which may be oxides, carbonates, nitrate, sulfates or other compounds of the constituent elements of the compound oxide, for example, a powder mixture of $Y_2O_3$, $BaO_2(SrO_2)$ and CuO, in such manner that atom ratios of Y:Ba(Sr):Cu in the mixture correspond to the final atom ratios of 1:2:3 which is realized in the product of superconducting wire, shaping or molding the mixture by means of an extruder, a press or the like, and then sintering the shaped powder mixture in an oxygen containing atmosphere.

In case of Ca-Sr-Bi-Cu-O type ceramics, the atom ratios of Ca:Sr:Bi:Cu may be adjusted to 1:1:1:2 by utilizing a powder mixture of $Bi_2O_3$, $SrCO_3$, $CaCO_3$ and CuO.

The shaping or molding of the powder mixture can be carried out by any one of known powder molding techniques, such as extrusion, compression, hot-pressing or the like. In a preferred embodiment of the present invention, the moldihg is performed by means of a friction driving type extruder.

The sintering may be carried out at a temperature range of from 700° to 1,000° C. which is selected in the function of the constituent elements of the ceramics. Therefore, the resulting sintered article possesses as a whole the crystal structure which exhibits superconductivity and hence no portion remains where superconductivity is not exhibited.

The metal pipes may be made of any metal which can endure the plastic deformation used in the present invention, and may be selected from a group comprising Cu, Al, Nb, V, Mo, Ta, and Ag and of an alloy including these metals as the base. These metal pipes made or ordinary conductors function as a stabilizer for a superconducting wire, namely the metal pipe will become an electric current circuit when superconductivity breaks accidentally. In other words, the method of the present invention produces a protective layer simultaneously when a superconducting wire is manufactured.

The plastic deformation may be performed mainly under compressive condition, for example by means of a swaging unit or rolls. It is important not to exert excess traction to the composite pipe of the metal pipe and the mass of oxide. In other words, it is necessary to carry out deformation of the composite mainly under compressed condition rather than under force of traction or drawing. The reason is that the mass of oxide used in the present invention has a layered perovskite structure, so that sliding among layers along c-axis occurs under compressive force, permitting a small amount of plastic deformation of the mass of oxide. Thus, the plastic deformation preformed mainly under compression strain according to the present invention allow a wire-manufacturing operation that can maintain continuity of the mass of oxide. To the contrary, it is difficult to produce a wire having sufficient continuity of the mass of oxide by a conventional wire-drawing in which plastic deformation is effected mainly by traction force. The abovementioned continuity of the mass of oxide can be assured also by the presence of the outer metal pipe which surrounds the inner mass of oxide.

It is also known that the abovementioned compound oxide show anisotropy of electric current so that the the superconducting current flows easily in parallel with the c-axis of crystals of the abovementioned compound oxide. Therefore, a higher amount of electric current, and hence higher critical current density (Jc) can be obtained according to the present invention, since sliding among crystal layers is effected along the c-axis and hence the c-axis of the mass of oxide becomes parallel with an axial direction of the resulting superconducting wire.

In conclusion, the process of the present invention can increase the critical current density (Jc) by increment of compacting density due to plastic deformation performed mainly by compression force and by improvement of orientation of c-axis.

It is also preferable to reheat the mass of oxide after the plastic deformation is complete in order to improve the superconducting condition of the resulting superconducting wire. This heat-treatment may be carried out at a temperature ranging from 700° to 1,100° C. It is also possible to remove the outer metal pipe mechanically or chemically after the plastic deformation.

Now, an apparatus which can be used to realize the abovementioned process according to the present invention will be described with reference to attached drawings which are not limitative of the present invention.

BRIEF DESCRIPTION OF THE DRAWINGS

FIG. 1 and FIG. 2 illustrate two different conditions of mass of oxide 1 contained in a metal pipe 2 before and after it is subjected to plastic deformation according to the present invention. In FIG. 1, a mass of oxide 1 which has been produced by an extruder shown in FIG. 3 is covered with a metal pipe 2.

FIG. 3 illustrates a friction driving type extruder which may be used for producing the mass of oxide 1. This friction driving type extruder itself is well-known and is described in Japanese patent laid-open NO. 47-31859. In this type extruder, material powder 4 is fed by a screw feeder (not shown) into an annular groove (not shown) defined between a stationary member 6 (so-called as a shoe) and a rotary member (so called as a wheel), so that the material powder 4 is driven or entrained by the wheel 5 and finally extruded through an orifice 7 in a form of a fine rod.

The resulting rod is then heated in an oven (not shown) at about 700° to 1,100° C. to produce a sintered mass of oxide 1.

Figure 1:
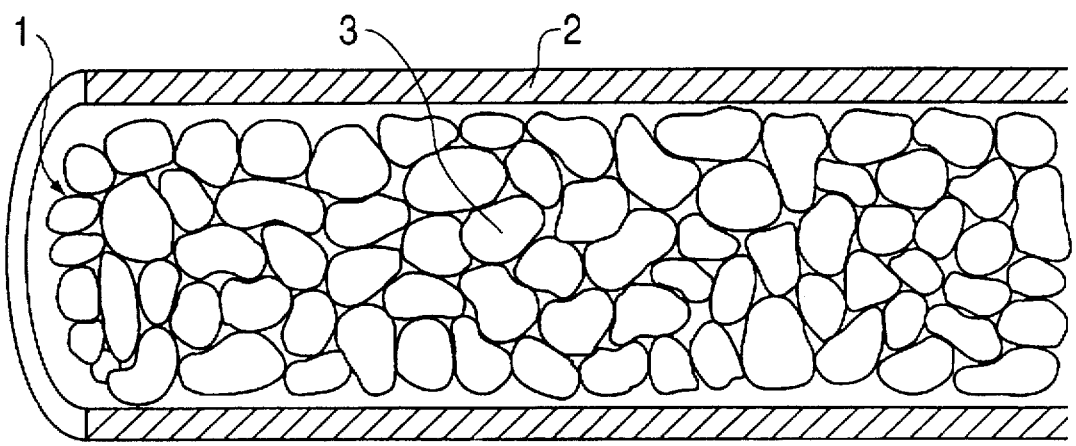
FIG. 1 illustrates a cross sectional view of a metal pipe containing a mass of oxide therein from which a superconducting wire is produced according to the present invention.
Figure 2:
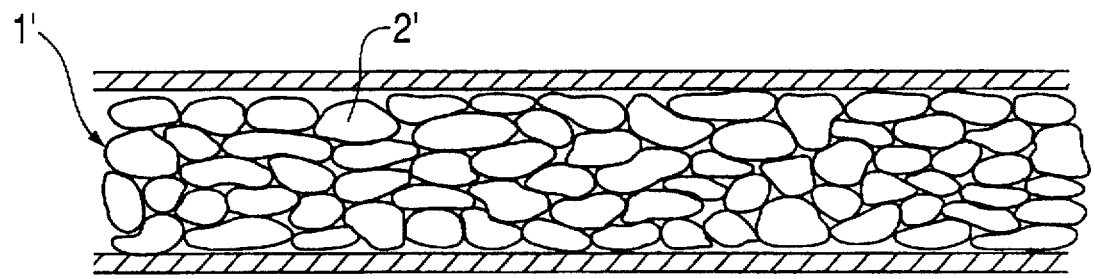
FIG. 2 illustrates a cross sectional view which shows a condition of the metal pipe after it is subjected to plastic deformation.

After the mass of oxide is covered with a metal pipe 2 (FIG. 1), the composite of the metal pipe 2 and the mass of oxide 1 is subjected to plastic deformation to reduce its diameter to the final dimension (FIG. 2).

Figure 4:
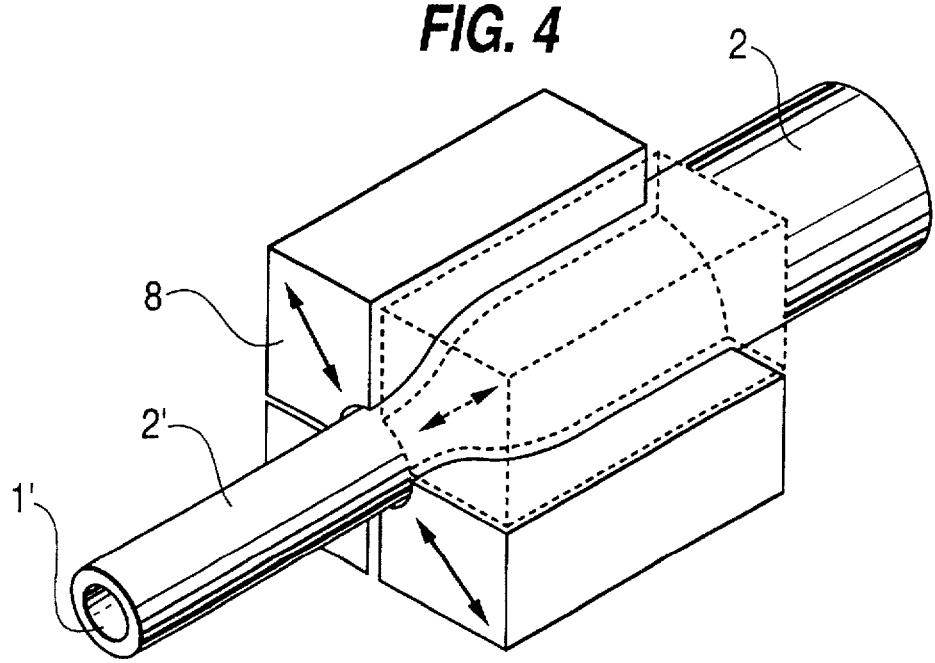
FIG. 4 illustrates a perspective view of a swaging die set which is used in the preferred embodiment of the present invention.

This plastic deformation may be performed by the swaging operation illustrated in FIG. 4. FIG. 4 shows a die assembly for performing swaging by means of four swaging dies 8 each of which reciprocates along a radial direction, so that the composite pipe (1,2) is compressed under compressive force while is advanced at a very low speed to obtain a wire comprising a reduced metal pipe 2' and a reduced mass of oxide 1'.

Now, the process according to the present invention will be described with reference to illustrative Examples, but the scope of the present invention should not be limited thereto.

EXAMPLE 1

Figure 3:
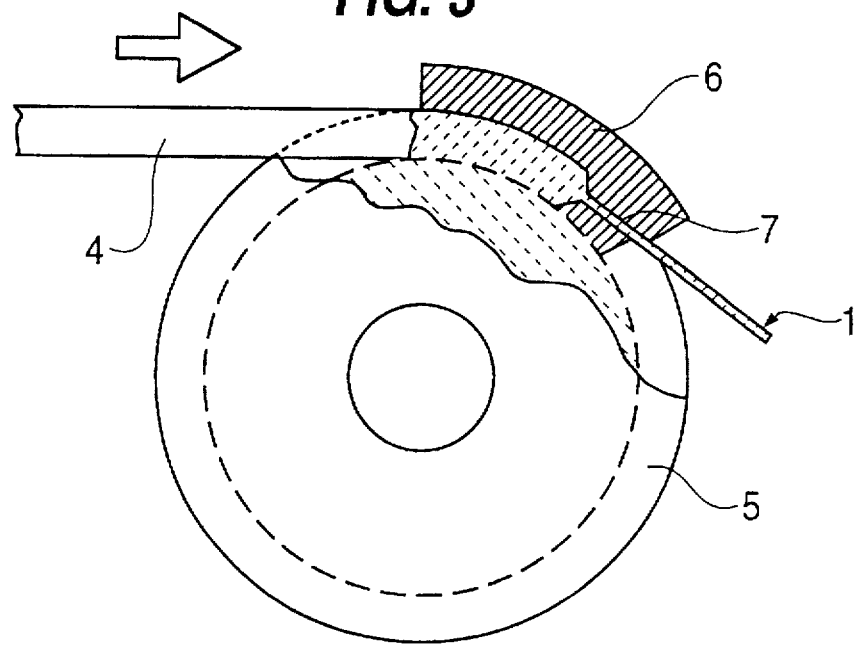
FIG. 3 shows the principle of a friction driving type extruder in a cross sectional view, which is used in one embodiment of the present invention.

Powders of $La_2O_3$, SrO and CuO (each having a particle size of less than 10 micron) were mixed with atom ratios of La:Sr:Cu of 1.5:0.4:1.0. The resulting mixture was then fed to a friction driving type extruder (Conforming unit) shown in FIG. 3 and was extruded at 800° C. to produce a rod. The extruded rod was then heated at 1,100° C. for 2 hours to produce a mass of oxide having the layered perovskite structure by solid reaction.

The resulting mass of oxide of a rod-shape having a diameter of 6 mm had a chemical composition of $La_{1.5}Sr_{0.4}Cu_{1.0}O_{4.0}$ and showed a critical temperature of 38 K when it was measured by the usual DC four probe method.

Then, the mass of oxide is inserted in a copper pipe (an outer diameter of 9 mm and an inner diameter of 6.5 mm) as is shown in FIG. 1 in which 1 was a copper pipe and 2 was the mass of oxide.

The composite (1+2) was subjected to swaging work to obtain a wire having an outer diameter of 3 mm.

The resulting wire showed superconductivity and functioned as a superconducting wire. It was also found that the wire did not melt even when the wire was placed under ordinary conductive condition during which electric current is maintained, so that the outer copper layer surrounding the mass of oxide functioned as a stabilizer.

EXAMPLE 2

Powders of $Y_2O_3$, $Ba_2CO_3$ and CuO were mixed with atom ratios of Y:Ba:Cu as 1:2:3 and the resulting mixture was sintered at 900° C. for 12 hours.

The resulting sintered body was pulverized to obtain a sintered powder which was then press-molded into a rod having an outer diameter of 5 mm and a length of 30 cm. The press-molded rod was then sintered at 900° C. for 2 hours to obtain a mass of oxide.

A pipe of Nb having an inner diameter of 5.5 mm was put on the mass of oxide and the resulting composite pipe of outer Nb pipe containing the mass of oxide therein was subjected to a swaging operation to reduce its outer diameter to 2 mm.

The resulting wire showed Tc (Critical temperature) of 77 K and Jc (Critical current density) of 200 A.

Then, the outer Nb pipe was removed by etching with nitric acid. The resulting naked mass of oxide was heat-treated at 945° C. for 12 hours and then cooled down to ambient temperature at a rate of 2° C./min.

The obtained final wire showed Tc of 90 K and Jc of 5,000A at 77 K.

EXAMPLE 3

36.42% by weight of commercially available $Bi_2O_3$ powder, 23.07% by weight of commercially available $SrCO_3$, 23.07% by weight of commercially available $CaCO_3$ and 24.87% by weight of commercially available CuO were mixed in an attoriter in wet and then dried. The dried powder was compacted under a pressure of 1,000 kg/cm² and then sintered at 800° C. in air for 5 hours. The sintered body was pulverized.

The resulting sintered powder was press-molded into a rod having an outer diameter of 6 mm and a length of 50 mm and then sintered at 830° C. for 12 hours.

The sintered rod or mass of oxide was covered with a silver pipe having an inner diameter of 6.5 mm and the composite of the silver pipe and the mass of oxide was subjected to a swaging operation to obtain a wire having a diameter of 2 mm. The resulting wire showed Tc of 77 K and Jc of 200 A.

The wire was further heat-treated at 830° C. for 12 hours and then quenched. The resulting wire showed Tc of 80 K.

What we claim are:

1. A process for manufacturing a compound oxide high-temperature superconducting wire, comprising the steps of:

forming powder material into a sintered rod of compound oxide superconductive material;

providing a metal pipe having an outer wall defining an outer diameter, and an innner wall defining an inner diameter;

inserting said sintered rod into said metal pipe such that said inner wall surrounds said sintered rod; and then subjecting said metal pipe to a plastic deformation operation that exerts mainly compressive strain upon said metal pipe, thereby reducing said outer diameter, said inner diameter, and a diameter of said sintered rod.

2. The process of claim 1, wherein said subjecting step comprises swaging said metal pipe.

3. The process of claim 1, wherein said forming step comprises one of press-molding the powder material and extruding the powder material.

4. A process for manufacturing a compound oxide high-temperature superconducting wire, comprising the steps of:

molding a material powder into a rod;

heating said rod, thereby producing a sintered rod of compound oxide superconductive material;

providing a metal pipe having an outer wall defining an outer diameter, and an innner wall defining an inner diameter;

inserting said sintered rod into said metal pipe such that said inner wall surrounds said sintered rod; and then subjecting said metal pipe to a plastic deformation operation that exerts mainly compressive strain upon said metal pipe, thereby reducing said outer diameter, said inner diameter, and a diameter of said sintered rod.

5. The method of claim 4, wherein said metal pipe is of a metal from the group consisting of: Cu, Al, Nb, V, Mo, Ta, and Ag and alloys including these metals as the base.

6. The method of claim 4, wherein said molding comprises extruding the material powder into the rod.

7. The method of claim 6, wherein said extruding step comprises utilizing a friction driving type extruder to extrude the material powder into the rod.

8. The process of claim 4, wherein heating step comprises heating said rod to a temperature between 700° and 1,000° C.

9. The process of claim 4, wherein said said subjecting step comprises swaging said metal pipe.

10. The process of claim 4, and further comprising the step of heat treating said metal pipe and superconductive material after said subjecting step.

\* \* \* \* \*